United States Patent [19]

Kruger et al.

[11] Patent Number: 5,729,140
[45] Date of Patent: Mar. 17, 1998

[54] SUPPRESSION OF ARTIFACTS IN NMR IMAGES BY CORRELATION OF TWO NEX ACQUISTIONS

[75] Inventors: David G. Kruger, Nelson, Wis.; Stephen J. Riederer, Rochester, Minn.

[73] Assignee: Mayo Foundation for Medical Education and Research, Rochester, Minn.

[21] Appl. No.: 726,892

[22] Filed: Oct. 4, 1996

[51] Int. Cl.$^6$ .................................................. G01V 3/00
[52] U.S. Cl. ...................................... 324/309; 324/307
[58] Field of Search ................................ 324/309, 307, 324/312, 314, 318, 300

[56] References Cited

U.S. PATENT DOCUMENTS

| | | | |
|---|---|---|---|
| 4,567,893 | 2/1986 | Charles et al. | 128/653 |
| 4,663,591 | 5/1987 | Pelc et al. | 324/309 |
| 4,706,026 | 11/1987 | Pelc et al. | 324/309 |
| 4,715,383 | 12/1987 | Ehman et al. | 128/653 |
| 4,731,583 | 3/1988 | Glover et al. | 324/309 |
| 4,950,991 | 8/1990 | Zur | 324/312 |
| 5,144,235 | 9/1992 | Glover et al. | 324/309 |
| 5,151,656 | 9/1992 | Maier et al. | 324/307 |
| 5,254,948 | 10/1993 | Sano et al. | 324/307 |
| 5,363,044 | 11/1994 | Xiang et al. | 324/309 |
| 5,581,184 | 12/1996 | Heid | 324/318 |

OTHER PUBLICATIONS

*Respiratory Ordering of Phase Encoding (ROPE): A Method for Reducing Respiratory Motion Artifacts in MR Imaging*, Bailes DR, Gilderdale DJ, Bydder GM J., Comput. Assist. Tomogr. 9, 835–38, (1985).

*Cardiac Imaging Using Gated Magnetic Resonance*, Lanzer P, Botvinick EH, Schiller NB, Radiology 150, 121,27 (1984).

*Spatial Presaturation: A Method for Suppressing Flow Artifacts and Improving Depiction of Vascular Anatomy in MR Imaging*, Felmlee JP, Ehman, RL, Radiology 164, 559–64, (1987).

*Motion Artifact Suppression Technique (MAST) for MR Imaging*, Pattany, PM, Phillips JJ, Chiu LC, J. Comput. Assist. Tomogr. 11, 369–77, (1987).

*Comparison of Breath–hold Fast Spin–echo and Conventional Spin–echo Pulse Sequences for T2–weighted MR Imaging of Liver Lesions*, Rydberg JN, Lomas DJ, Coakley KJ, Hough DM, Ehman RL, Riederer SJ, Radiology 194, 531–37, (1995).

*A New Way of Averaging With Application to MRI*, Madore B, and Henkelman RM, Med. Phys. 23(1), 109–12, (1996).

*Two–point Interference Method for Suppression of Ghost Artifacts Due to Motion*, Xiang QS, Bronskill MJ, and Henkelman RM, JMRI 3, 900–906, (1993).

*Motion Artifact Reduction wth Three–Point Ghost Phase Cancellation*, Xiang QS, Henkelman RM, JMRI 1, 933–42, (1992).

*Ghost Phase Cancellation wth Phase–encoding Gradient Modulation*, Hinks RS, Xiang QS, and Henkelman RM, JMRI 3, 777–85, (1993).

*Aquistion Order and Motional Artifact Reduction of Spin Wrap Images* MRM 6, 74–83 (1988), Dixon, et al.

*"Crisscross" MR Images, Improved Resolution by Averaging Signals with Swapped Phase–encoding Axes*, Radiology 1994, vol. 193, No. 1, 276279, Hamilton, et al.

Primary Examiner—Louis M. Arana
Attorney, Agent, or Firm—Quarles & Brady

[57] ABSTRACT

A method for removing artifacts from NMR images in which two NMR data sets $S_1$ and $S_2$ for two images of the region of interest are acquired. The correlation of the two data sets Sand $S_2$ is produced as part of the Fourier transformation image reconstruction process and a corrected image is reconstructed from the result. Modulations which are different in the two NMR data sets Sand $S_2$ are removed, while common signals produced by stationary structures contribute to the image.

7 Claims, 2 Drawing Sheets

SUPPRESSION OF ARTIFACTS IN NMR IMAGES BY CORRELATION OF TWO NEX ACQUISTIONS

This invention was made with U.S. Government support awarded by the National Institute Of Health (NIH) Grant No.: CA 37911-10. The U.S. Government has certain rights in this invention.

BACKGROUND OF THE INVENTION

The field of the invention is nuclear magnetic resonance imaging methods and systems. More particularly, the invention relates to the reduction of artifacts in MRI images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. The acquired NMR data is referred to as k-space data, where $k_y$ is an axis indicative of the encoding applied along the y-axis and $k_x$ is an orthogonal axis indicative of the encoding along the x-axis. Typically, phase encoding is applied along $k_y$ and frequency encoding is applied along $k_x$.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method for Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being images as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing image Artifacts Due To Periodic Signal Variations In NMR Imaging". In this method, the non-monotonic view order is determined as the scan is executed and is responsive to changes in the period so as to produce a desired relationship (low frequency or high frequency) between the signal variations and the gradient parameters. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling". This method is useful in situations where the motion velocity (i.e. direction and magnitude) is known.

Another commonly used method to correct for ghosting caused by pulsatile flow is described in U.S. Pat. No. 4,715,383. This method is referred to as "presaturation". Signal from blood spins upstream from the volume of interest is saturated by exciting a slab of tissue. With proper timing, when the saturated blood spins reach the volume of interest, little or no signal is produced by them, and thus, little or no ghosting occurs.

As opposed to incorporation of artifact reduction techniques into the image acquisition, it is also possible to remove ghost artifacts retrospectively by post processing. As described in U.S. Pat. No. 4,937,526, for example, the acquired NMR data set is examined and certain corrections are made for view-to-view and in-view motion. These methods also include the acquisition of two, three or more complete NMR data sets as described in U.S. Pat. No. 5,363,044 that may be analyzed to model the modulation of the k-space data by the motion as discussed by:

Madore B., and Henkelman R. M., "A new way of averaging with applications to MRI," Med. Phys. 23(1), 109–13, (1996);

Xiang Q. S., Bronskill M. J. and Henkelman R. M., "Two-point interference method for suppression of ghost artifacts due to motion," JMRI 3, 900–906, (1993);

Xiang Q. S., and Henkelman R. M., "Motion artifact reduction with three-point ghost phase cancellation," JMRI 1, 633–42, (1992); and Hinks R. S., Xiang Q. S., and Henkelman R. M., "Ghost phase cancellation with phase-encoding gradient modulation," JMRI 3, 777–85, (1993).

These method use a weighted average of k-space data and attempt to solve for the actual image data by minimizing the gradient energy operator. These methods have shown minimal improvement when applied to in vivo images.

SUMMARY OF THE INVENTION

The present invention is a method for producing a magnetic resonance image with reduced artifacts caused by noise, flow, and patient motion. More particularly, the method includes the steps of: acquiring a first NMR data set $S_1$ from which the desired image can be reconstructed; acquiring a second NMR data set $S_2$ from which the desired image can be reconstructed; calculating the correlation between the two NMR data sets $S_1$ and $S_2$ to produce a correlation array $\Gamma$; and producing a corrected image from the correlation array $\Gamma$. The two NMR data sets $S_1$ and $S_2$ are acquired under conditions in which the undesired modulations are different such that they are removed by the correlation step. In the preferred embodiment this is accomplished by simply swapping the readout and phase encoding gradient directions before acquiring the second NMR data set $S_2$.

A general object is to reduce image artifacts. Any artifact modulation that appears differently in the two NMR data sets $S_1$ and $S_2$ is effectively reduced by the correlation step. Thus, for example, phase errors due to motion along a $G_y$ phase encoding gradient axis in the first NMR data set $S_1$ will be totally different in the second NMR data set $S_2$ which employs a $G_x$ phase encoding gradient.

Another object of the invention is to remove artifacts caused by random motion. The method of the present invention does not require that the motion be "modeled" in order that corrective data can be calculated. Instead, the correlation step will filter out such artifacts as long as the signal modulations they produce in the first and second NMR data sets $S_1$ and $S_2$ are different.

Yet another object of the invention is to remove artifacts without significantly increasing data acquisition or image reconstruction time. The present invention requires a 2 NEX acquisition, but otherwise the acquisition time is not increased and the additional computations are minimal. The key realization is that the correlation step can be carried out rather simply as part of the routine Fourier transformation process used to reconstruct the image. Thus, no hardware modifications are required and the image is produced in about the same amount of time as a normal 2 NEX image using the same pulse sequence. While a 2 NEX acquisition might be the desired protocol, two (2) ½ NEX acquisitions may also be acquired. The normal ½ NEX phase correction is not needed and the total acquisition time is comparable to one (1) standard 1 NEX acquisition. Zero padding is used to fill each k-space data set to the desired matrix size.

Another object of the present invention is to provide an artifact reduction method which can be used with nearly any NMR pulse sequence and with other artifact suppression methods. For example, the present invention may be employed along with spatial presaturation, gradient moment nulling and reordered phase encoding methods. It does not require any significant modification of commercially available MRI systems.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

The method of the present invention requires the acquisition of MRI k-space data with frequency encoding in one direction (e.g. x-axis) defined as $S_1(k_y,k_x)$ plus a second data set with frequency encoding in another direction (e.g. y-axis) defined as $S_2(k_x,k_y)$. While x and y are used as examples, any two orthogonal directions in three-dimensional space may be used. This creates a pair or NMR data sets with unwanted modulation in orthogonal directions. In this example, the unwanted modulation is typically along the phase encoding axis, $k_y$ in the $S_1$ data set and along $k_x$ in the $S_2$ data set. Although complete othogonality shows the best performance, it is expected that less than perfect orhtogonality (i.e. less than 90°) will result in varying degrees of correction as long as the undesired modulation in the two NMR data sets is partially uncorrelated.

The modulation correction according to the present invention is performed via the correlation of $S_1$ and $S_2$. Two-dimensional correlation is defined as:

$$S(k_x,k_y) = S_1(k_x, k_y)**S_2(k_x, k_y) =$$  (1)

$$\int_{-\infty}^{\infty} \int_{-\infty}^{\infty} S_1(k_x', k_y') S_2^*(k_x' - k_x, k_y' - k_y) dk_x' dk_y'$$

where ** denotes correlation and * denotes the complex conjugate. In practice, we use the fact that the Fourier transform of the correlation of $S_1$ and $S_2$ is equivalent to the product of the individual Fourier transforms of $S_1$ and $S_2$ or:

$$FT\{S_1**S_2\}=FT\{S_1\}\cdot FT\{S_2\}^*=I_1(x,y)\cdot I_2^*(x,y)=I'(x,y)$$  (2)

where FT{ } is the Fourier transform operator and * is again the complex conjugate. In addition, $I_1$ and $I_2$ are defined to be the Fourier transforms of $S_{1\ and\ S2}$; i.e. the actual images reconstructed from the NMR data sets. Because in general $I_1$ and $I_2$ will have unequal complex parts, the image $I'(x,y)$ in equation (2) will also be complex. To produce the same scaling as a magnitude image reconstructed individually from either $S_1$ or $S_2$, the square root of the magnitude of $I'(x,y)$ must be taken or:

$$I_c = \sqrt{|I'(x, y)|}$$  (3)

where:

$$|I'(x, y)| = \sqrt{I'(x, y) \cdot I'^*(x, y)}$$  (4)

$I_c$ is then the correlated image, with the same scaling as $I_1$ or $I_2$. Although it is not proven here, applying a convolution in place of the correlation of equation (2) will provide the same results for $I_c$ and is an equivalent solution.

DESCRIPTION OF THE PREFERRED EMBODIMENT

Figure 1:
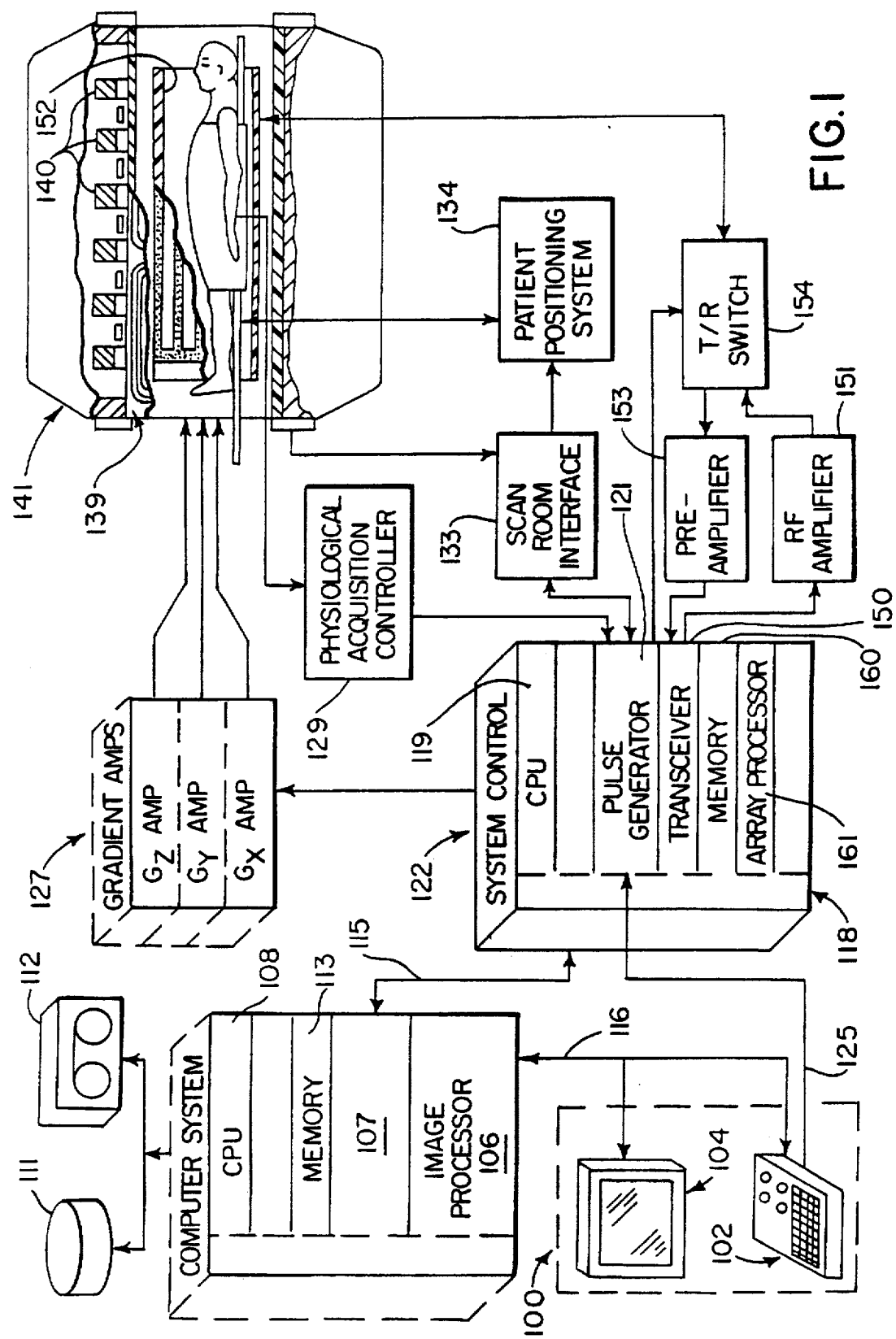
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125.

It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be immediately processed by the image processor 106 according to the present invention and conveyed to the operator console 100 and presented on the display 104.

For a more detailed description of the transceiver 150, reference is made to U.S. Pat. Nos. 4,952,877 and 4,992,736 which are incorporated herein by reference.

The MRI system of FIG. 1 is programmed to practice the present invention. The acquisition of the NMR data sets $S_1$ and $S_2$ is performed in response to a pulse sequence downloaded to the pulse generator 121, the image reconstructions are performed by the array processor 161, and the processing of the reconstructed images is performed in the image processor 106.

Figure 2:
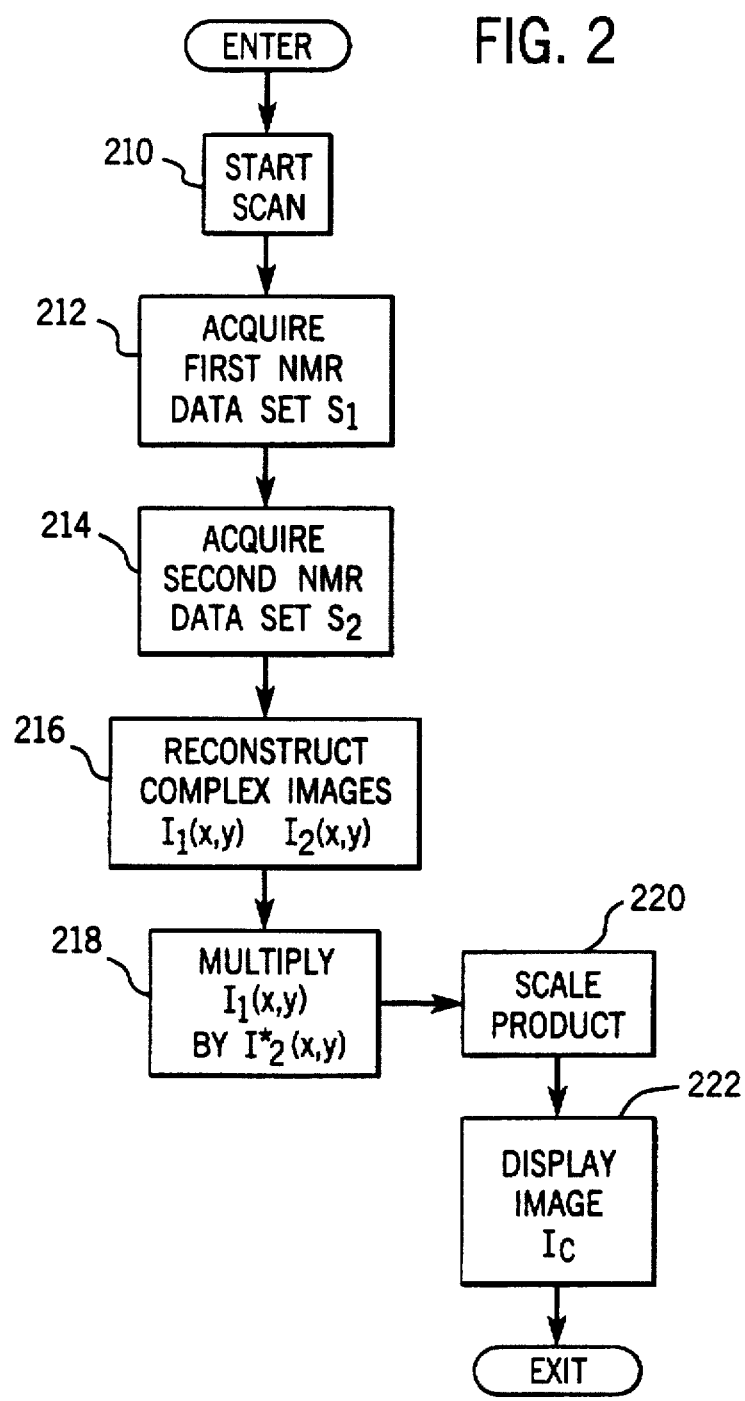
FIG. 2 is a flow chart illustrating the steps performed by the MRI system of FIG. 1 to practice the preferred embodiment of the invention.

Referring particularly to FIG. 2, when the scan is started at process block 210 the selected imaging pulse sequence is downloaded to the pulse generator 121 and the MRI system performs its usual pre-scan procedures. In the preferred embodiment a spin-warp pulse sequence is used, such as a spin-echo pulse sequence described in U.S. Pat. Nos. 4,471,306 and 4,665,365, a fast spin-echo pulse sequence described in U.S. Pat. No. 5,378,985, or a fast gradient recalled echo pulse sequence described in U.S. Pat. No. 5,291,891. All of these pulse sequences are characterized by the use of two substantially orthogonal imaging magnetic field gradients which encode the NMR data along two different axes in k-space.

As indicated at process block 212, a first NMR data set $S_1$ is acquired with the selected pulse sequence. The two physical gradient fields $G_x$ and $G_y$ are used in their customary manner during this first acquisition as a readout gradient that frequency encodes the NMR data and as a phase encoding gradient respectively. The sampling of k-space is performed such that the desired image size and resolution may be reconstructed from the data set $S_1$.

As indicated at process block 214, a second NMR data set $S_2$ is then acquired with the same pulse sequence, but with the functions of the two imaging gradient fields reversed. That is, the physical gradient field $G_x$ is now used as the phase encoding gradient in the pulse sequence and the physical gradient $G_y$ is used as the readout gradient. Otherwise, the sampling of k-space is the same as that used to acquire the first data set $S_1$. As indicated at process block 216, both NMR data sets $S_1$ and $S_2$ are Fourier transformed by the array processor 161 to produce two corresponding image data sets $I_1(x,y)$ and $I_2(x,y)$. It can be appreciated, however, that the reconstruction of first image $I_1(x,y)$ may actually take place concurrently with the acquisition of the second NMR data set $S_2$.

An optional method would interleave single or multiple view acquisitions in single view (or views) with phase encoding in one direction. With the following rf excitation, the phase encoding direction is switched by 90 degrees. Then from one large data set, the two data sets $S_1(k_x,k_y)$ and $S_2(k_x,k_y)$ are produced and reconstructed as in process block 216.

The acquired NMR data $S_1$ and $S_2$ is complex data having in-phase (I) values and quadrature (Q) values. The phase information indicted by these quadrature values is preserved in the image reconstruction, and the images $I_1(x,y)$ and $I_2(x,y)$ are also arrays of complex values. As indicated at process block 218, the complex conjugate (*) of the second image $I_2(x,y)$ is calculated by reversing the sign of all its quadrature values (Q), and then each complex value in the first image array $I_1(x,y)$ is multiplied by the corresponding complex value in the second image array $I_2*(x,y)$. The resulting product $\Gamma(x,y)$ is a corrected image array comprised of complex values as set forth above in equation (2).

As indicated by process block 220, the next step scales the values in the corrected image array $\Gamma(x,y)$ as set forth above in equation (3). The complex conjugate array $\Gamma^*(x,y)$ is calculated by changing the sign of each of its quadrature values (Q) and each value in the corrected image array $\Gamma(x,y)$ is then multiplied by each corresponding conjugate value in the array $\Gamma^*(x,y)$. The magnitude of each value in the resulting image array $I_c$ is then calculated and used to control the intensity of a pixel in the displayed image as indicated at process block 222.

We claim:

1. A method for producing an NMR image of a subject with an MRI system, the steps comprising:

a) acquiring a first NMR data set $S_1$ indicative of the subject using the MRI system;

b) acquiring a second NMR data set $S_2$ indicative of the subject using the MRI system;

c) calculating the correlation between the two NMR data sets $S_1$ and $S_2$ to produce correlation data in a correlation array $\Gamma$; and d) producing a corrected image from the correlation data in the correlation array $\Gamma$.

2. The method as recited in claim 1 in which step a) is performed using a first NMR pulse sequence that acquires NMR data indicative of the subject and containing first artifact-producing data, and step b) is performed using a second NMR pulse sequence that acquires NMR data indicative of the subject and containing second artifact-producing data.

3. The method as recited in claim 2 in which the first NMR pulse sequence includes application of a phase encoding magnetic field gradient along one axis and a readout magnetic field gradient along a second axis, and the second NMR pulse sequence includes application of a phase encoding magnetic field gradient along the second axis and a readout magnetic field gradient along the first axis.

4. The method as recited in claim 3 in which the first and second axes are substantially perpendicular.

5. The method as recited in claim 1 in which step c) is performed by Fourier transforming the first NMR data set $S_1$ to produce a first transformed data set $I_1$, Fourier transforming the second NMR data set $I_2$, and multiplying one of said transformed data sets $I_1$ or $I_2$ by the complex conjugate of the other one of said transformed data sets $I_1$ or $I_2$.

6. The method as recited in claim 1 in which step d) is performed by calculating the magnitude of the correlation data in the correlation array $\Gamma$.

7. The method as recited in claim 6 in which step d) is performed by calculating the square root of the magnitude of the correlation data in the correlation array $\Gamma$.

* * * * *